United States Patent
Sugimoto et al.

(10) Patent No.: US 7,604,765 B2
(45) Date of Patent: Oct. 20, 2009

(54) ELECTRONIC CIRCUIT DEVICE AND MANUFACTURING METHOD OF THE SAME

(75) Inventors: Keiichi Sugimoto, Kariya (JP); Mitsuru Nakagawa, Chiryu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/715,392

(22) Filed: Mar. 8, 2007

(65) Prior Publication Data

US 2007/0161269 A1    Jul. 12, 2007

Related U.S. Application Data

(62) Division of application No. 11/408,076, filed on Apr. 21, 2006, now Pat. No. 7,458,823.

(30) Foreign Application Priority Data

Apr. 22, 2005   (JP)   ............................. 2005-125573

(51) Int. Cl.
*B29C 39/10*   (2006.01)
*B29C 70/72*   (2006.01)

(52) U.S. Cl. .................. 264/272.17; 264/511; 264/263; 264/272.15; 264/334

(58) Field of Classification Search ........................ None
See application file for complete search history.

(56) References Cited

U.S. PATENT DOCUMENTS

| | | | |
|---|---|---|---|
| 4,775,333 A | 10/1988 | Grider et al. | |
| 5,120,231 A | 6/1992 | Masumoto | |
| 5,264,656 A | 11/1993 | Itakura et al. | |
| 5,447,888 A * | 9/1995 | Takashima et al. | ............ 29/827 |
| 5,478,517 A * | 12/1995 | Erdos | ......................... 264/161 |
| 5,677,568 A | 10/1997 | Ochi et al. | |
| 5,774,342 A | 6/1998 | Brandenburg et al. | |

(Continued)

FOREIGN PATENT DOCUMENTS

DE    10 2004 026870    12/2004

(Continued)

OTHER PUBLICATIONS

Office Action dated Jan. 15, 2008 issued in U.S. Appl. No. 11/408,076.

(Continued)

*Primary Examiner*—Edmund H. Lee
(74) *Attorney, Agent, or Firm*—Nixon & Vanderhye P.C.

(57) ABSTRACT

A casing of an electronic key transmitting and receiving apparatus is formed to seal entire bodies of circuit parts, a mounting face of a printed board, on which the circuit parts are mounted, and parts of terminals while the other parts of the terminals are exposed. A rear face of the printed board opposite from the mounting face provides a part of an outer surface of the casing. When the printed board is provided in the casing through an insert molding process, the printed board is held in a cavity of a molding die such that the rear face of the printed board closely contacts an inner face of the cavity. Accordingly, deformation of the printed board due to pressure caused when the resin is poured or when the resin hardens is inhibited.

9 Claims, 2 Drawing Sheets

U.S. PATENT DOCUMENTS

| | | |
|---|---|---|
| 6,787,093 B2 * | 9/2004 | Kiritani .................. 264/511 |
| 7,118,646 B2 | 10/2006 | Hunkeler |
| 7,144,258 B2 | 12/2006 | Ariga et al. |
| 2005/0136852 A1 | 6/2005 | Nakagawa et al. |
| 2006/0077643 A1 | 4/2006 | Mayuzumi et al. |
| 2006/0272150 A1 | 12/2006 | Eguchi et al. |

FOREIGN PATENT DOCUMENTS

| | | |
|---|---|---|
| JP | 61-222715 | 10/1986 |
| JP | 61-268416 | 11/1986 |
| JP | 05-59807 | 3/1993 |
| JP | 6-224241 | 8/1994 |
| JP | 8-63567 | 3/1996 |
| JP | 9-120852 | 5/1997 |
| JP | 9-234984 | 9/1997 |
| JP | 10-79453 | 3/1998 |
| JP | 2001-237022 | 8/2001 |
| JP | 2004-52471 | 2/2004 |
| JP | 2004-111435 | 4/2004 |
| JP | A-2004-134198 | 4/2004 |

OTHER PUBLICATIONS

Office Action dated Apr. 3, 2008 in U.S. Appl. No. 11/408,076.
Chinese Official Action dated Aug. 1, 2008, issued in counterpart Chinese Application No. 200610077782.4 with English translation.
Office Action dated Jul. 12, 2007, issued in U.S. Appl. No. 11/408,076.
German Office Action dated Oct. 23, 2007 issued in corresponding German Application No. 10 2006 018 364.9-55 with English translation.
Information Offer Form dated Sep. 24, 2008, submitted in counterpart Japanese Application No. 2005-125573, with translation.
Information Offer Form submitted in corresponding Japanese Application No. 2005-125573 dated Oct. 22, 2007 with English translation.
Chinese Office Action dated Jun. 5, 2009, issued in counterpart Chinese Application No. 2006100777824, with English translation.

* cited by examiner

ELECTRONIC CIRCUIT DEVICE AND MANUFACTURING METHOD OF THE SAME

CROSS REFERENCE TO RELATED APPLICATION

This application is a divisional of U.S. application Ser. No. 11/408,076 filed Apr. 21, 2006, now U.S. Pat. No. 7,458,823, and is based on and incorporates herein by reference Japanese Patent Application No. 2005-125573 filed on Apr. 22, 2005.

BACKGROUND OF THE INVENTION

1. Field of the Invention

The present invention relates to an electronic circuit device and a manufacturing method of the same. For example, the present invention is suitably used in a transmitting and receiving apparatus of an electronic key system of an automobile and the like and a manufacturing method of the same.

2. Description of Related Art

A known electronic circuit device as a transmitting and receiving apparatus of an electronic key system used in an automobile and the like accommodates a circuit board mounted with electronic parts, a battery and the like in a case in the shape of a flat plate (as described in JP-A-2004-52471, for example).

Generally, the case of the transmitting and receiving apparatus is made of a resin material. The circuit board is sealed in the case by performing an insert molding process of the circuit board along the flat-plate-shaped case when the case is molded. In this type of known electronic circuit device, both faces of the circuit board are entirely covered by the resin material. During the molding process of the case, the circuit board is held in the air inside a cavity of a molding die of the case with a holding pin formed in the molding die. Thus, the holding pin inside the molding die is necessary, and a structure of the molding die is complicated. In this case, a trace of the holding pin remains in the case as a hole after the molding process, deteriorating appearance. Moreover, there is a possibility that the circuit board is deformed because pressure locally acts on the circuit board due to hardening temperature difference of the resin or the mounted electronic parts are damaged when the resin hardens inside the molding die.

SUMMARY OF THE INVENTION

It is an object of the present invention to provide an electronic circuit device and a manufacturing method of the same capable of preventing problems such as deformation of a circuit board or damage to electronic parts in a structure in which a case is molded to seal the circuit board with a resin material, while improving appearance of the molded case.

According to an aspect of the present invention, an electronic circuit device includes a circuit board having a mounting face, on which a circuit part is mounted, a terminal, which is mounted on the circuit board and electrically connected with the circuit board, and a casing made of a resin material. The casing is formed to seal an entire body of the circuit part, the mounting face of the circuit board, and a part of the terminal with a resin material such that the other part of the terminal is exposed. The other face of the circuit board opposite from the mounting face provides a part of an outer surface of the casing.

The circuit board is held in a cavity of a molding die such that the other face of the circuit board opposite from the mounting face closely contacts the molding die when the casing is molded with the resin material. Therefore, deformation of the circuit board is inhibited when pressure caused by injection of the resin or hardening of the resin acts on the circuit board.

Since the circuit board is held to closely contact the molding die in the cavity of the molding die, a holding pin provided in a case molding die of a conventional electronic circuit device is unnecessary. Thus, a hole in the case is eliminated and an electronic circuit device having a casing with excellent appearance is provided. As a result, an electronic circuit device capable of preventing problems such as deformation of the circuit board or damage to the electronic parts while improving the appearance of the molded casing is realized.

According to another aspect of the present invention, a manufacturing method of the electronic circuit device includes a holding step of holding the circuit board in the cavity of the molding die of the casing such that the other face of the circuit board opposite from the mounting face closely contacts a wall face of the molding die, a filling step of filling the resin material into the cavity after the holding step, and a hardening step of hardening the resin material in the cavity.

When the casing is molded by the resin molding process, both of resin pressure caused when the resin is filled and resin pressure caused when the resin hardens act on one face of the circuit board, i.e., the face on which the circuit parts are mounted. Thus, the circuit board is pressed against the molding die. As a result, deformation of the circuit board and damage to the circuit parts can be surely inhibited.

The circuit board is held in the cavity of the molding die such that the circuit board closely contacts the molding die. Therefore, the holding pin of the case molding die of the conventional electronic circuit device is unnecessary. Thus, the cost of the molding die can be reduced. The hole formed in the case of the conventional electronic circuit device can be eliminated. Thus, the appearance of the molded casing can be improved.

BRIEF DESCRIPTION OF THE DRAWINGS

Features and advantages of an embodiment will be appreciated, as well as methods of operation and the function of the related parts, from a study of the following detailed description, the appended claims, and the drawings, all of which form a part of this application. In the drawings:

DETAILED DESCRIPTION OF EXAMPLE EMBODIMENT

Figure 1:
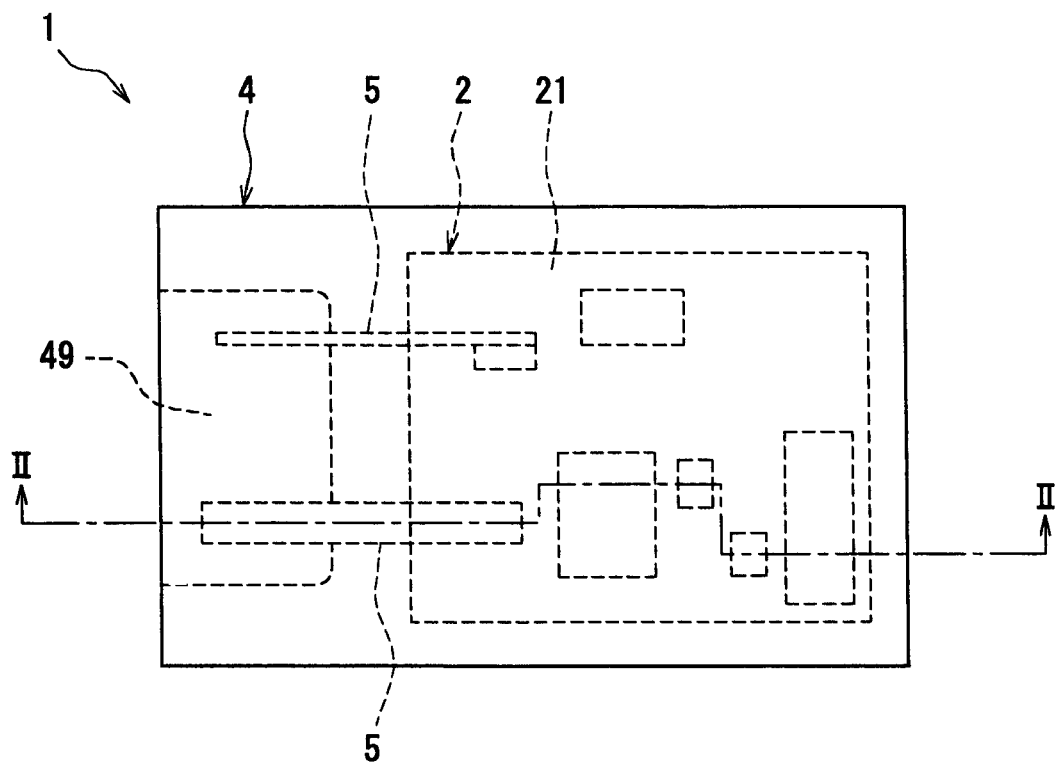
FIG. 1 is a front view showing an electronic key transmitting and receiving apparatus according to an example embodiment of the present invention.
Figure 2:
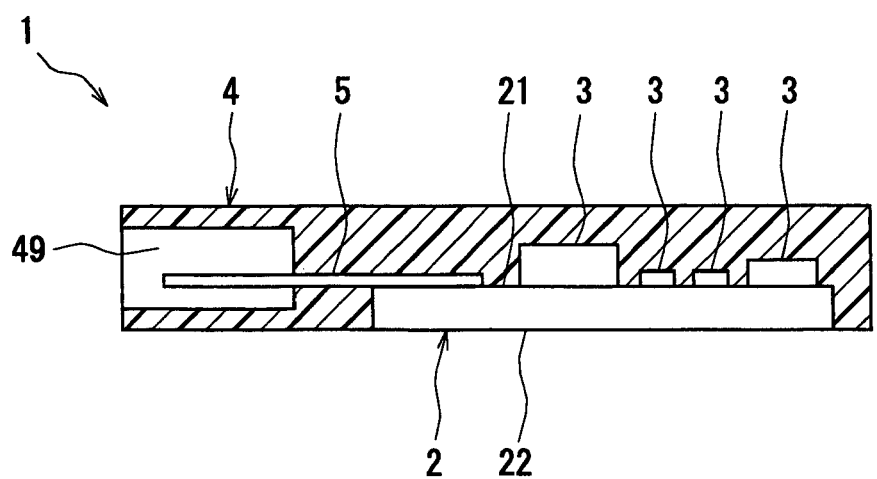
FIG. 2 is a cross-sectional view showing the electronic key transmitting and receiving apparatus of FIG. 1 taken along the line II-II.

Referring to FIGS. 1 and 2, an electronic circuit device according to an example embodiment of the present invention is illustrated. As an example, the electronic circuit device according to the present embodiment is applied to an electronic key transmitting and receiving apparatus 1 as a transmitting and receiving apparatus of an electronic key system of an automobile and the like.

The electronic key transmitting and receiving apparatus 1 has a circuit board (printed board) 2 mounted with electronic parts 3, battery terminals 5 soldered to the circuit board 2, a casing 4 formed of a resin material to seal entire bodies of the electronic parts 3, the circuit board 2, and parts of the terminals 5, and the like as shown in FIGS. 1 and 2. A battery accommodation chamber 49 is formed in the casing 4. A battery and a battery cover are not shown in FIGS. 1 and 2.

The printed board 2 is made by forming a wiring pattern (not shown) of an electric conductor such as a copper foil on a board made of a glass epoxy resin and the like. The board is not limited to the glass epoxy resin. Other types of resin boards or ceramic boards may be used.

The circuit parts 3 are mounted on the printed board 2. The circuit parts 3 include a resistor, a capacitor, a diode, a transistor, IC, an antenna, and the like. The circuit parts 3 are mounted only on a mounting face 21 as one side of the printed board 2. Nothing is mounted on a rear face 22 of the printed board 2 opposite from the mounting face 21. The rear face 22 is flat and smooth. The terminals 5 to be connected with the battery (not shown) are soldered to the printed board 2. Two terminals 5 are provided to contact a positive electrode and a negative electrode of the battery respectively.

The casing 4 is formed of a resin material to seal the entire bodies of the circuit parts 3 mounted on the printed board 2, the mounting face 21 of the printed board 2 and the parts of the terminals 5 as shown in FIG. 2. When the casing 4 is formed through a resin molding process, the resin material is poured while the rear face 22 of the printed board 2 is kept in close contact with a wall surface of a molding die in a cavity of the molding die. Thus, the rear face 22 of the printed board 2 is exposed at the surface of the casing 4. More specifically, a resin surface of the casing 4 and the rear face 22 of the printed board 2 are smoothly continuous, defining the same face. Thus, the rear face 22 of the printed board 2 constitutes a part of the outer surface of the casing 4. The casing 4 shown in FIG. 1 is formed substantially in the shape of a card having substantially the same dimensions (86 mm×54 mm) as an ID-1 card used as a usual credit card.

In the electronic key transmitting and receiving apparatus 1 of the present embodiment, an epoxy resin as a heat-hardening resin is used as the resin material forming the casing 4. In the case where the molding process is performed with the heat-hardening resin, temperature of the molding die should be set at temperature suitable for a hardening reaction of the resin. The used epoxy resin has hardening reaction temperature sufficiently lower than a melting point of the solder used to mount the circuit parts 3 and the terminals 5 onto the printed board 2. Thus, damage to the printed board 2, which is provided in the casing 4 through the insert molding process, i.e., peeling of the mounted circuit parts 3 and the like, due to the temperature of the molding die during the molding process is inhibited. The electronic key transmitting and receiving apparatus 1 of the present example embodiment uses a solder having the melting point of 240° C. and an epoxy resin having the hardening reaction temperature of 170° C.

There is a possibility that a vehicle driver always carries the electronic key transmitting and receiving apparatus 1 in a pocket or the electronic key transmitting and receiving apparatus 1 is left on a dashboard in the automobile. Therefore, the electronic key transmitting and receiving apparatus 1 should be preferably made of a material having excellent mechanical strength and heat-resistance.

The electronic key transmitting and receiving apparatus 1 according to the present embodiment uses as the material of the casing 4 the epoxy resin, which is a heat-hardening resin having excellent heat-resistance and mechanical strength, thereby improving reliability of the electronic key transmitting and receiving apparatus 1. The material of the casing 4 is not limited to the epoxy resin used in the electronic key transmitting and receiving apparatus 1 according to the present embodiment. Other kinds of heat-hardening resins may be used. Also in this case, the melting point of the solder has to be higher than the hardening reaction temperature of the resin material.

Next, a manufacturing method of the electronic key transmitting and receiving apparatus 1 according to the present embodiment, specifically, a manufacturing method of the casing 4, will be explained.

Figure 3:
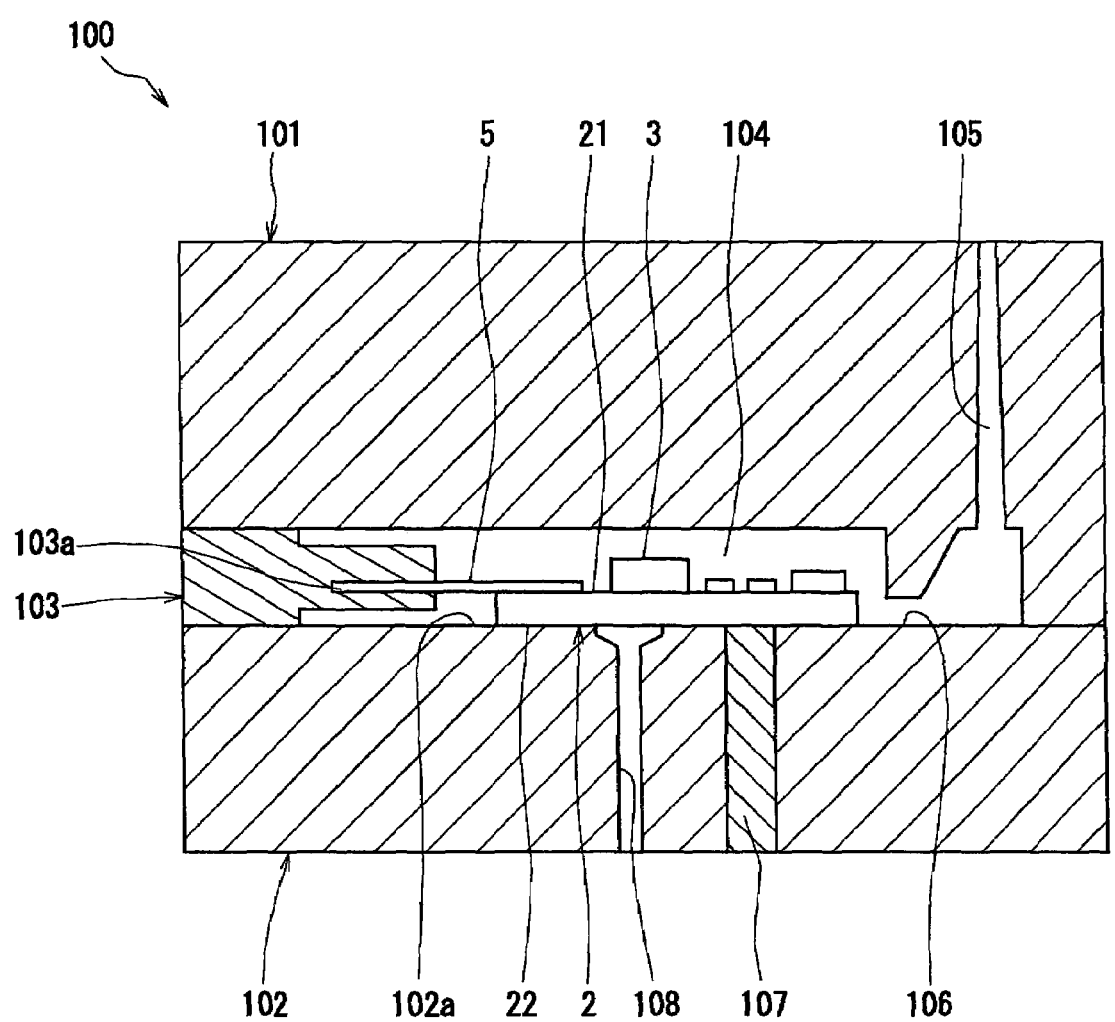
FIG. 3 is a cross-sectional view showing a molding die used to mold a casing of the electronic key transmitting and receiving apparatus according to the FIG. 1 embodiment.

FIG. 3 is a schematic diagram showing a structure of a molding die 100 used to manufacture the casing 4 of the electronic key transmitting and receiving apparatus 1 according to the present embodiment. FIG. 3 shows a state of completion of mold clamping of the molding die 100, i.e., a state immediately before resin filling.

The molding die 100 has an upper mold 101, a lower mold 102 and a slide core 103 as shown in FIG. 3. In the mold clamping of the molding die 100, the slide core 103 moves from the left to the right in FIG. 3 on a surface 102a of the lower mold 102 due to an influence of an inclined pin (not shown) and the like belonging to the molding die 100, and stops at a position shown in FIG. 3. The slide core 103, the upper mold 101 and the lower mold 102 define a cavity 104 (product portion defining an entity of the casing 4).

The upper mold 101 is formed with a sprue 105 as a supply passage of the resin to be filled through a gate 106 into the cavity 104. The lower mold 102 has a knockout pin 107 for separating the casing 4 as the resin mold product from the lower mold 102 after the completion of the molding process. The knockout pin 107 is provided at a place where the knockout pin 107 contacts the rear face 22 of the printed board 2 at the completion of the mold clamping of the molding die 100 as shown in FIG. 3. The casing 4 is separated from the lower mold 102 by knocking out the printed board 2. The lower mold 102 is formed with a suction hole 108 for suctioning and holding the printed board 2, which is set inside the cavity 104, with a negative pressure. The suction hole 108 is connected with an exterior vacuum pump (not shown) through a pipe (not shown). When needed, the pressure in the suction hole 108 is controlled to a negative pressure.

Next, a manufacturing method of the casing 4 using the molding die 100 having the above-described structure will be explained. The circuit parts 3 and the terminals 5 have been already mounted to the printed board 2 in FIG. 3.

First, the printed board 2 as the inserted part, which is to be provided inside the casing 4 through the insert molding process, is set in the cavity 104 in a state before the mold clamping of the molding die 100, i.e., in a state in which the upper mold 101 and the lower mold 102 are vertically separated from each other and the slide core 103 has moved leftward in FIG. 3 in contact with the lower mold 102. More specifically, the terminals 5 of the printed board 2 are fit into holding holes 103a of the slide core 103 while the rear face 22 of the printed board 2 is kept in close contact with the surface 102a of the lower mold 102. At that time, tip ends of the terminals 5 are forced to contact bottom portions of the holding holes 103a. Thus, the position of the printed board 2 inside the cavity 104, i.e., the horizontal position of the printed board 2 in FIG. 3, is determined.

Then, the mold clamping of the molding die 100 is performed. That is, the lower mold 102 and the slide core 103 are moved upward in FIG. 3 such that the lower mold 102 and the slide core 103 closely contact the upper mold 101. At that time, the slide core 103 moves from the left to the right in FIG. 3 and stops at the position shown in FIG. 3. Then, the pressure inside the suction hole 108 is controlled to a negative pressure such that the negative pressure applies a downward force to the printed board 2 in FIG. 3. Thus, the printed board 2 closely contacts the surface 102a of the lower mold 102. Thus, a holding step of holding the printed board 2 in the cavity 104 is completed.

After the printed board 2 is held in the cavity 104 of the molding die 100 as shown in FIG. 3, a nozzle of an injection unit (not shown) is fit to the upper end of the sprue 105 of the upper mold 101. A melted resin in a liquid state (epoxy resin in this example embodiment) is injected through the gate 106 to fill the cavity 104. If the resin thoroughly spreads in the cavity 104 and the sprue 105 is filled with the resin, the injection of the resin is stopped and a filling step ends.

The resin filled in the cavity 104 is deprived of heat by the molding die 100. Thus, the resin is gradually cooled to harden from a portion contacting the inner face of the cavity 104. The resin is cooled to harden, forming the casing 4. Thus, a hardening step ends.

Then, the lower mold 102 and the slide core 103 are moved downward in FIG. 3 to be separated from the upper mold 101. At that time, the slide core 103 moves leftward in FIG. 3 such that the terminals 5 of the printed board 2 separate from the holding holes 103a of the slide core 103.

Subsequently, the application of the negative pressure into the suction hole 108 of the lower mold 102 is stopped to bring about the atmospheric pressure in the suction hole 108. The knockout pin 107 is moved upward in FIG. 3 to separate the casing 4 from the lower mold 102.

Thus, the manufacturing of the casing 4 of the electronic key transmitting and receiving apparatus 1 according to the present embodiment is completed.

In the electronic key transmitting and receiving apparatus 1 according to the present embodiment, the casing 4 is formed of the resin material to seal the entire bodies of the circuit parts 3, the mounting face 21 of the printed board 2, on which the circuit parts 3 are mounted, and the parts of the terminals 5 while the other parts of the terminals 5 are exposed, and the rear face 22 of the printed board 2 opposite from the mounting face 21 constitutes a part of the outer surface of the casing 4.

In the process of providing the printed board 2 in the casing 4 through the insert molding process, the printed board 2 is held in the cavity 104 of the molding die 100 such that the rear face 22 closely contacts the inner face of the cavity 104. Accordingly, deformation of the printed board 2 due to the pressure caused when the resin is poured or when the resin hardens can be surely prevented.

The printed board 2 is held in the cavity 104 of the molding die 100 such that the rear face 22 closely contacts the inner face of the cavity 104, rendering a holding pin of a case mold of a conventional electronic circuit device unnecessary. A hole in the case is eliminated. Thus, the electronic key transmitting and receiving apparatus 1 having the casing 4 with excellent appearance can be provided.

Thus, the electronic key transmitting and receiving apparatus 1 capable of suppressing deformation of the printed board 2 and damage to the circuit parts 3 during the insert molding while achieving excellent appearance of the casing 4 is realized.

If the knockout pin 107 of the molding die 100 is located at the resin portion of the casing 4, there is a possibility that appearance or a design level of the casing 4 is degraded because a boundary line between the lower mold 102 and the knockout pin 107 is copied to a resin surface of the casing 4 and remains or because a pin trace remains on the resin surface when the casing 4 is knocked out by the knockout pin 107.

In contrast, in the electronic key transmitting and receiving apparatus 1 according to the present embodiment, the knockout pin 107 of the molding die 100 contacts the rear face 22 of the printed board 2. Therefore, no boundary line is copied to the rear face 22 of the printed board 2 and no trace of the knockout pin 107 remains. Thus, the appearance of the casing 4 is improved.

In the electronic key transmitting and receiving apparatus 1 according to the present embodiment, a negative pressure is introduced to the suction hole 108 formed in the lower mold 102 to hold the printed board 2 in the cavity 104 of the molding die 100 in the manufacturing process of the casing 4. Alternatively, the suction hole 108 may be eliminated. In this case, the printed board 2 is held in the cavity 104 solely by the fitting between the terminals 5 and the slide core 103.

In the above-explained example embodiment, the electronic circuit device is applied to the electronic key transmitting and receiving apparatus 1 for the automobile. Usage of the electronic circuit device is not limited to the electric key transmitting and receiving apparatus 1. The present invention may be applied to other types of electronic circuit devices mounted in the automobile. Further, the present invention may be applied not only to various electronic circuit devices for the automobile but also to electronic circuit devices used in various types of consumer-use devices.

The present invention should not be limited to the disclosed embodiment, but may be implemented in many other ways without departing from the spirit of the invention.

What is claimed is:

1. A manufacturing method for manufacturing an electronic circuit device including a circuit board with a circuit part mounted thereon, a terminal mounted on and electrically connected with the circuit board, and a casing made of a resin material sealing the circuit part, said method comprising:

holding the circuit board in a cavity of a molding die of the casing such that an other face of the circuit board, opposite a mounting face of the circuit board on which the circuit part is mounted, directly closely contacts a wall face of the molding die;

filling the cavity with the resin material after the holding step, the other face of the circuit board being pressed against the wall face of the molding die by resin pressure caused by the filling of the resin material into the cavity, such that the resin material envelops and seals the circuit part, the mounting face of the circuit board, and a part of the terminal, while a remaining part of the terminal and the other face of the circuit board are free from said resin material; and hardening the resin material in the cavity whereby a remaining part of the terminal and to the other face of the circuit board are exposed and an outer peripheral surface of a portion of the casing surrounding the exposed part of the terminal is disposed in a same plane as the other face of the circuit board and forms a part of an outer peripheral surface of the electronic circuit device with the other face of the circuit board.

2. The manufacturing method as in claim 1, wherein the filling step seals the terminal, the circuit part and the circuit board with the resin material in a state in which the remaining part of the terminal and the other face of the circuit board are exposed out of the casing.

3. The manufacturing method as in claim 1, wherein the cavity is defined by multiple molds and a slide core.

4. The manufacturing method as in claim 3, wherein the holding step performs mold clamping for closely contacting the molds and the slide core.

5. The manufacturing method as in claim 3, wherein the holding step fits the terminal into a holding hole of the slide core such that a tip end of the terminal contacts a bottom portion of the holding hole while keeping the other face of the circuit board in close contact with a surface of one of the molds.

6. The manufacturing method as in claim 1, wherein the holding step closely contacts the other face of the circuit board to the wall face of the molding die by using a negative pressure in a suction hole that is formed in the molding die and connected with a negative pressure source.

7. The manufacturing method as in claim 1, wherein the filling step pours the resin into the cavity through a sprue formed in the molding die.

8. The manufacturing method as in claim 1, further comprising: separating the molded casing from the molding die by pushing the other face of the circuit board with a knockout pin after the hardening step.

9. The manufacturing method as in claim 8, wherein the holding step locates the knockout pin in the molding die at a position where the knockout pin contacts the other face of the circuit board.

\* \* \* \* \*